United States Patent
Yen et al.

(10) Patent No.: US 9,590,582 B2
(45) Date of Patent: Mar. 7, 2017

(54) SEMICONDUCTOR DEVICE WITH INDUCTOR-CAPACITOR RESONANT CIRCUIT

(71) Applicant: REALTEK SEMICONDUCTOR CORP., Hsinchu (TW)

(72) Inventors: Hsiao-Tsung Yen, Hsinchu (TW); Yuh-Sheng Jean, Hsinchu (TW); Ta-Hsun Yeh, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 7 days.

(21) Appl. No.: 14/338,904

(22) Filed: Jul. 23, 2014

(65) Prior Publication Data

US 2015/0303888 A1    Oct. 22, 2015

(30) Foreign Application Priority Data

Apr. 16, 2014 (TW) .............. 103113947 A

(51) Int. Cl.
*H03H 7/01* (2006.01)
*H01L 23/66* (2006.01)
(Continued)

(52) U.S. Cl.
CPC ....... *H03H 7/0115* (2013.01); *H01L 23/5223* (2013.01); *H01L 23/5227* (2013.01);
(Continued)

(58) Field of Classification Search
CPC .............. H03H 7/0115; H01F 27/2804; H01F 2027/2809; H01F 17/0013; H01L 23/5223; H01L 23/5227
(Continued)

(56) References Cited

U.S. PATENT DOCUMENTS 8,362,591 B2   1/2013 Yen et al.
8,552,812 B2  10/2013 Yen et al.
(Continued)

FOREIGN PATENT DOCUMENTS

TW   200943707       10/2009
TW   201003883 A1    1/2010
(Continued)

*Primary Examiner* — Stephen E Jones
*Assistant Examiner* — Rakesh Patel
(74) *Attorney, Agent, or Firm* — Muncy, Geissler, Olds & Lowe, P.C.

(57) ABSTRACT

A semiconductor device with an inductor-capacitor (LC) resonant circuit includes a first insulation layer, an inductor component, and a capacitor component. The inductor component includes a coil-conductor segment and two extension-conductor segments. The coil-conductor segment and the extension-conductor segments are located on a same surface of the first insulation layer, and the extension-conductor segments are coupled to two ends of the coil-conductor segment, respectively. The extension-conductor segments are arranged at an interval, and extend outwards relative to the coil-conductor segment. A first region is defined by the extension-conductor segments and the coil-conductor segment, and the capacitor component is arranged corresponding to the first region in an embedded manner on the other surface, opposite to the inductor component, of the first insulation layer.

9 Claims, 17 Drawing Sheets

(51) Int. Cl.
*H01L 23/522* (2006.01)
*H01L 49/02* (2006.01)

(52) U.S. Cl.
CPC ............. *H01L 23/66* (2013.01); *H01L 28/10* (2013.01); *H01L 28/40* (2013.01); *H01L 2223/6672* (2013.01); *H01L 2924/0002* (2013.01); *H01L 2924/19011* (2013.01); *H01L 2924/19041* (2013.01); *H01L 2924/19042* (2013.01)

(58) Field of Classification Search
USPC .......................... 333/175, 177, 185; 336/200
See application file for complete search history.

(56) References Cited

U.S. PATENT DOCUMENTS

| | | | |
|---|---|---|---|
| 2009/0322447 A1* | 12/2009 | Daley | H01L 23/5223 333/185 |
| 2011/0128084 A1 | 6/2011 | Jin et al. | |
| 2015/0145615 A1* | 5/2015 | Jing | H01L 23/5227 333/174 |

FOREIGN PATENT DOCUMENTS

| | | |
|---|---|---|
| TW | 201206059 A1 | 2/2012 |
| TW | 201232579 A1 | 8/2012 |

* cited by examiner

SEMICONDUCTOR DEVICE WITH INDUCTOR-CAPACITOR RESONANT CIRCUIT

CROSS-REFERENCES TO RELATED APPLICATIONS

This non-provisional application claims priority under 35 U.S.C. §119(a) on Patent Application No. 103113947 filed in Taiwan, R.O.C. on 2014 Apr. 16, the entire contents of which are hereby incorporated by reference.

BACKGROUND

Technical Field

The present invention relates to a semiconductor device, and in particular to a semiconductor device with an inductor-capacitor (LC) resonant circuit.

Related Art

With the development trend of integration of multiple functions of an electronic product, more and more circuit elements need to be designed integrally in a semiconductor chip.

A typical semiconductor integrated circuit includes a silicon substrate. More than one insulation layer is arranged on the substrate, more than one metal layer of is arranged in the insulation layer, and the metal layers may be formed with a built-in part of a chip by means of a semiconductor fabrication process. Therefore, in order to reduce the volume of an electronic product, various electronic elements are arranged in an embedded manner in place of an arrangement manner adopting a surface mount technology (SMT).

In design of circuits such as a filter, a network impedance matching circuit, a voltage-controlled oscillator (VCO), a transmitting and receiving module circuit, an LC resonant circuit is usually used for signal transmission or filtration. At a high frequency, a signal may pass through the insulation layer and leak to the silicon substrate, resulting in transmission loss. Therefore, how to design an embedded LC resonant circuit to achieve a further compact size with no or lesser influencing effects of signal transmission or filtration is one of the projects that are researched by relevant circuit designers with continuous effort.

SUMMARY

In an embodiment, a semiconductor device with an LC resonant circuit includes a first insulation layer, an inductor component, and a capacitor component. The inductor component includes a coil-conductor segment and two extension-conductor segments. The coil-conductor segment and the extension-conductor segments are located on a same surface of the first insulation layer, and the extension-conductor segments are coupled to two ends of the coil-conductor segment, respectively. The extension-conductor segments are arranged at an interval, and extend outwards relative to the coil-conductor segment. A first region is defined by the extension-conductor segments and the coil-conductor segment, and the capacitor component is arranged corresponding to the first region in an embedded manner on the other surface, opposite to the inductor component, of the first insulation layer.

In conclusion, according to the semiconductor device with an LC resonant circuit, the LC resonant circuit may be integrated on a semiconductor substrate by means of a three-dimensional (3D) die stacking technology, and a resonant capacitor is arranged corresponding to an input/output part of the inductor component, so as to reduce generation of phase noise, arrangement of interconnecting wires, and an overall size. In some embodiments, in the semiconductor device with an LC resonant circuit according to the present invention, other electronic components are further arranged corresponding to the input/output part or a staggered part of the inductor component, so as to further reduce generation of phase noise, arrangement of interconnecting wires, and the overall size.

BRIEF DESCRIPTION OF THE DRAWINGS

The present invention will become more fully understood from the detailed description given herein below for illustration only, and thus are not limitative of the present invention, and wherein.

DETAILED DESCRIPTION

Figure 1:
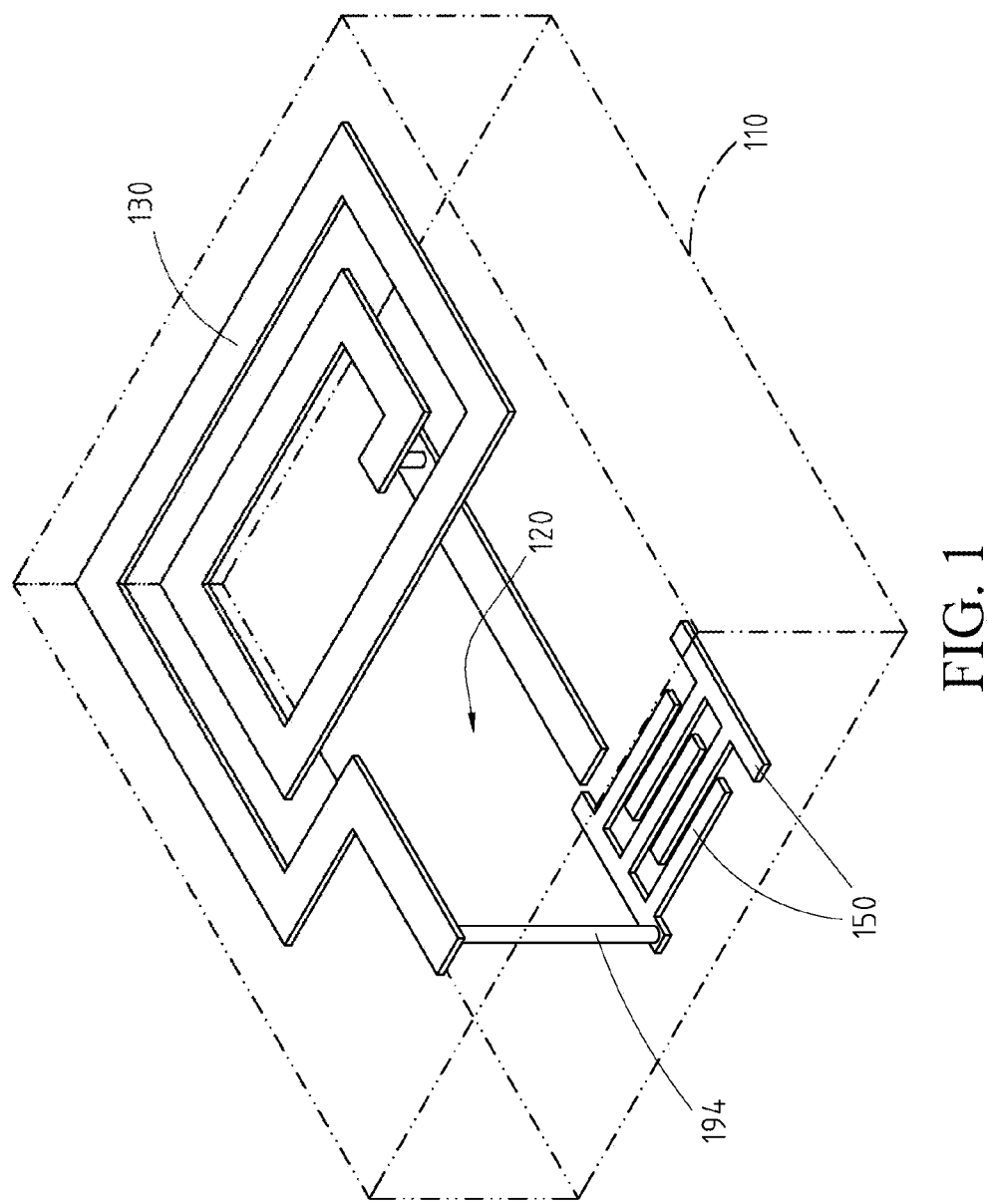
FIG. 1 is a perspective view of a semiconductor device with an LC resonant circuit according to a first embodiment of the present invention.

In order to clearly show all elements, sometimes an insulation layer may be shown in the drawings in a transparent or omitted manner, and therefore is not limitative of the disclosure. Moreover, the terms such as "first", "second", "third", and "fourth" described hereinafter are used for distinguishing indicated elements rather than sequencing or limiting the difference of the indicated elements or limiting the scope of the present invention.

Figure 2:
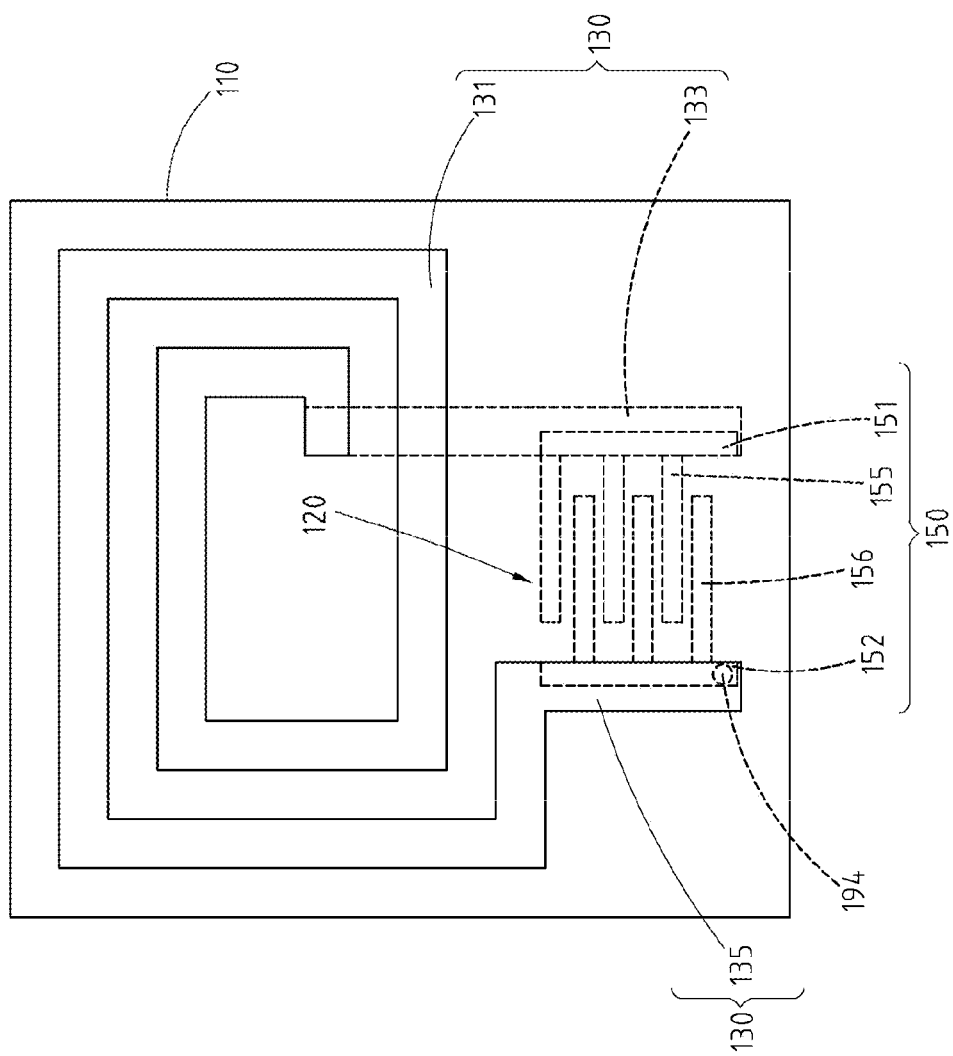
FIG. 2 is a top view of the semiconductor device shown in FIG. 1.
Figure 3:
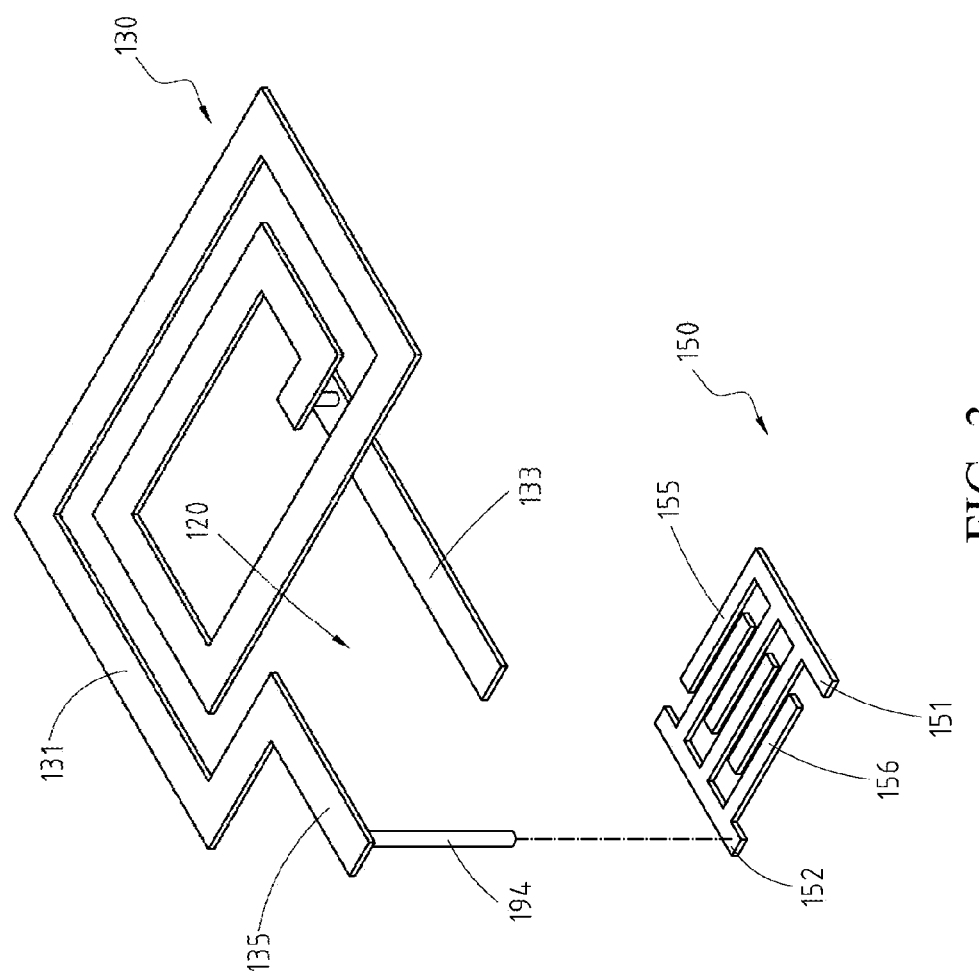
FIG. 3 is an exploded view of the semiconductor device shown in FIG. 1.
Figure 4:
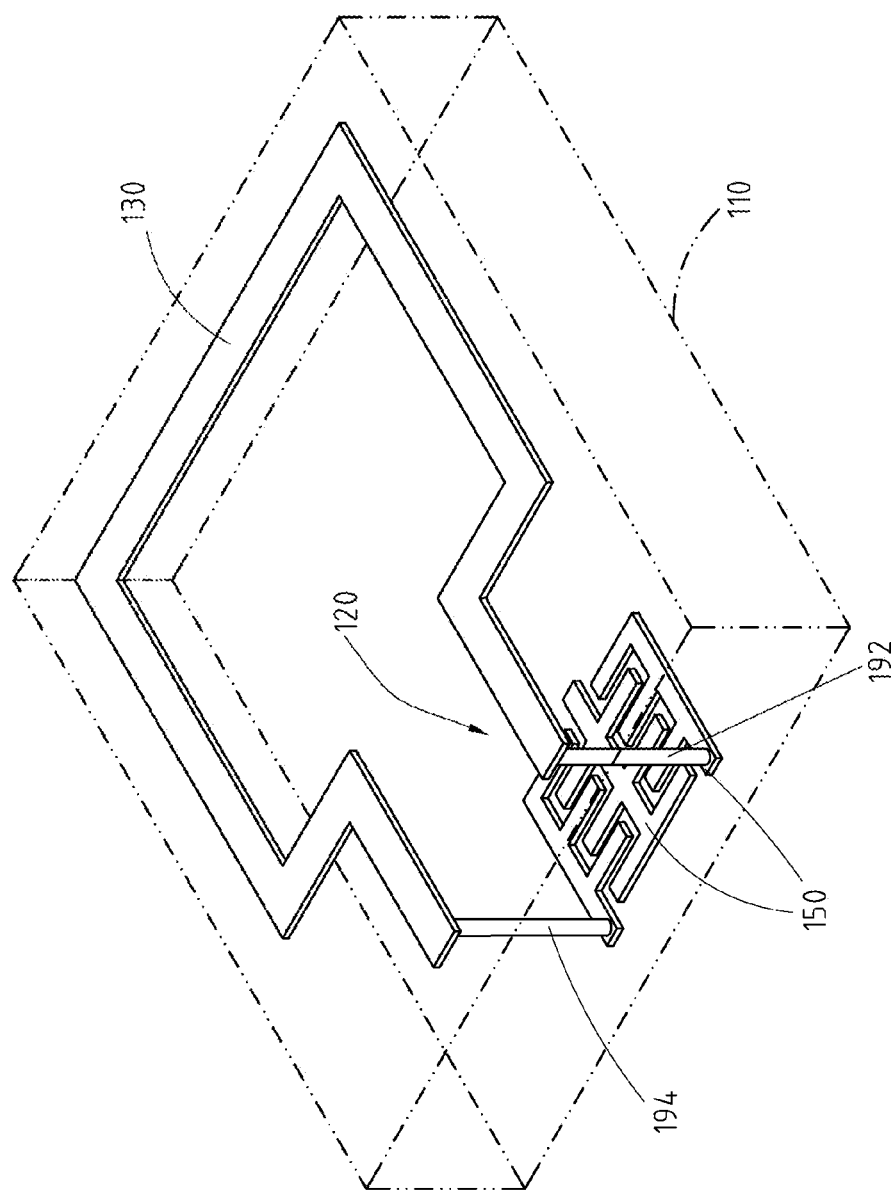
FIG. 4 is a perspective view of a semiconductor device with an LC resonant circuit according to a second embodiment of the present invention.
Figure 5:
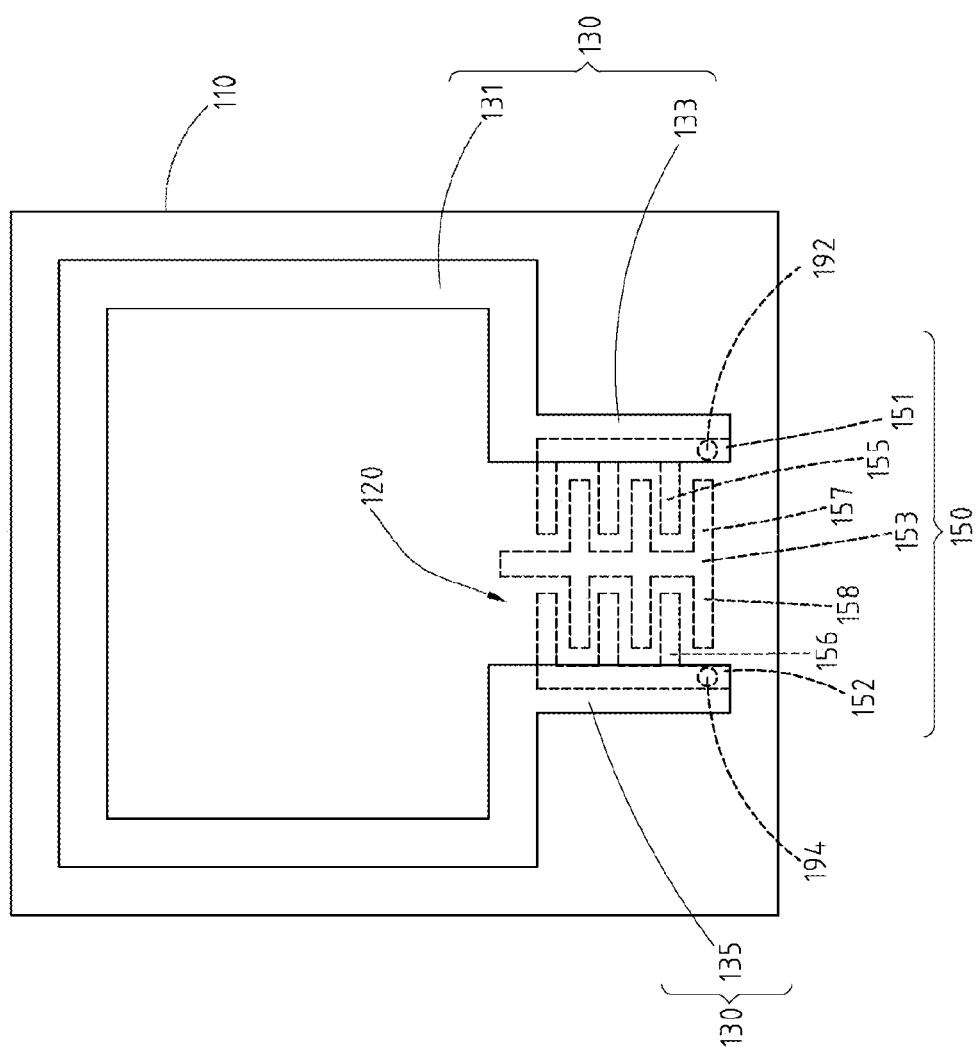
FIG. 5 is a top view of the semiconductor device shown in FIG. 4.
Figure 6:
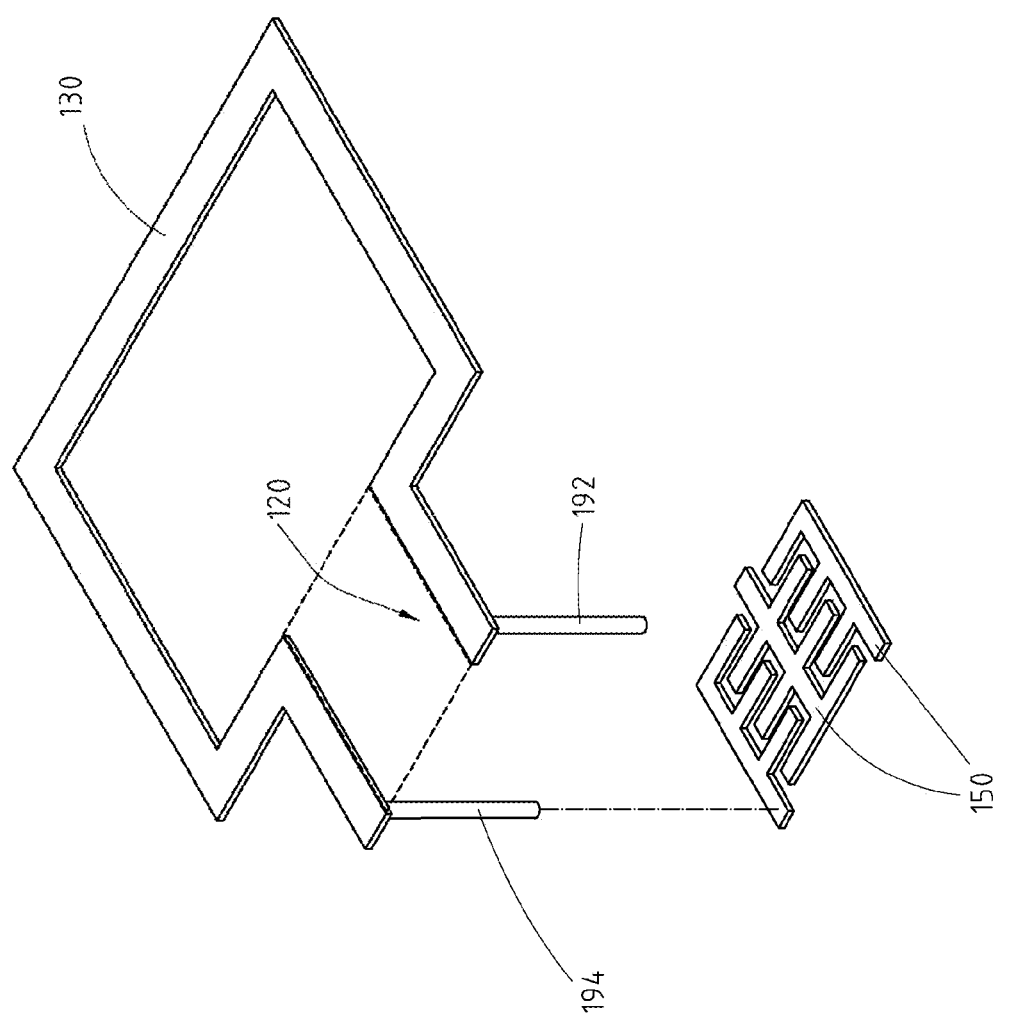
FIG. 6 is an exploded view of the semiconductor device shown in FIG. 4.

FIG. 1 to FIG. 3 are schematic views of a semiconductor device with an LC resonant circuit according to a first embodiment of the present invention, and FIG. 4 to FIG. 6 are schematic views of a semiconductor device with an LC resonant circuit according to a second embodiment of the present invention.

Referring to FIG. 1 to FIG. 6, the semiconductor device with an LC resonant circuit includes an insulation layer 110 (hereinafter referred to as a first insulation layer 110), an inductor component 130, and a capacitor component 150.

The inductor component 130 and the capacitor component 150 are formed by patterning two metal layers located on two opposite surfaces of the first insulation layer 110. In other words, the inductor component 130 is formed on (or above) an upper surface of the first insulation layer 110, and the capacitor component 150 is formed on (or below) a lower surface of the first insulation layer 110. The inductor component 130 and the capacitor component 150 may be formed by more than one metal layer.

The inductor component 130 includes a coil-conductor segment 131 and two extension-conductor segments 133 and 135. The coil-conductor segment 131 serves as an induction part of an inductor for the electromagnetic induction. The extension-conductor segments 133 and 135 serve as an input/output part for receiving or transmitting a signal. The coil-conductor segment 131 and the extension-conductor segments 133 and 135 are located on the upper surface of the first insulation layer 110. The extension-conductor segments 135 may be located on the upper surface of the first insulation layer 110 or in the first insulation layer 110.

The two extension-conductor segments 133 and 135 are arranged at an interval and coupled to two ends of the coil-conductor segment 131, respectively. In other words, the two extension-conductor segments 133 and 135 are directly connected to the two ends of the coil-conductor segment 131 and extend outwards relative to the coil-conductor segment 131 from the two ends of the coil-conductor segment 131. In other words, the extension-conductor segments 133 and 135 extend in a direction away from the coil-conductor segment 131.

Here, the two extension-conductor segments 133 and 135 are located at a same side of the coil-conductor segment 131, and a region 120 (hereinafter referred to as a first region 120) is defined by the two extension-conductor segments 133 and 135 and the coil-conductor segment 131.

The capacitor component 150 is arranged, corresponding to the first region 120, on the other surface (that is, a lower surface of the first insulation layer 110), opposite to the inductor component 130, of the first insulation layer 110 in an embedded manner. In other words, the capacitor component 150 is located below the first region 120 and spaced by the first insulation layer 110 from the inductor component 130.

In some embodiments, the inductor component 130 may be of a flat spiral or stacking helical shape (that is, multiple metal layers are connected to form a helical shape). The coil-conductor segment 131 and the two extension-conductor segments 133 and 135 are formed by patterning multiple metal layers.

In other embodiments, referring to FIG. 4 to FIG. 6, the inductor component 130 is a symmetric inductor having geometric symmetry. Here, the coil-conductor segment 131 and the two extension-conductor segments 133 and 135 are single wiring paths separately. The two extension-conductor segments 133 and 135 are approximately parallel to each other. The extension-conductor segment 133 is joined to a first end of the coil-conductor segment 131 and is approximately perpendicular to a joining position between the extension-conductor segment 133 and the coil-conductor segment 131. The extension-conductor segment 135 is joined to a second end of the coil-conductor segment 131 and is approximately perpendicular to a joining part of the extension-conductor segment 135 and the coil-conductor segment 131. The first region 120 is located between the coil-conductor segment 131 and the two extension-conductor segments 133 and 135. Here, the coil-conductor segment 131 and the two extension-conductor segments 133 and 135 are formed by pattering a metal layer.

Here, the capacitor component 150 may be entirely and correspondingly arranged between the outer sides of the extension-conductor segments 133 and 135. Moreover, the capacitor component 150 may also be correspondingly located between the outer side of one of the extension-conductor segments 133 and 135 and an inner side of the other of the extension-conductor segments 133 and 135. In addition, the capacitor component 150 may be entirely and correspondingly arranged between the inner sides of the extension-conductor segments 133 and 135.

The capacitor component 150 may be in a single-ended (as shown in FIG. 1 to FIG. 3) or differential (as shown in FIG. 4 to FIG. 6) form. All capacitors in the capacitor component 150 in these embodiments share a same metal layer; however, the present invention is not limited thereto. Capacitors connected in parallel may be formed by using various different metal layers to increase a capacitance value, or a semiconductor transistor capacitor arranged below the capacitor component 150 may be further connected in parallel or used.

In some embodiments, referring to FIG. 1 to FIG. 3, the capacitor component 150 includes two connecting segments 151 and 152 (hereinafter referred to as a first connecting segment 151 and a second connecting segment 152) and a plurality of electrode segments 155 and 156 (hereinafter referred to as a first electrode segment 155 and a second electrode segment 156).

The electrode segments 155 and 156 serve as electrode plates of the capacitor, capacitive induction is generated between the electrode segments 155 and 156. The connecting segments 151 and 152 are used for receiving or transmitting a signal. The connecting segments 151 and 152 and the electrode segments 155 and 156 are all formed on the lower surface of the first insulation layer 110. Here, the connecting segments 151 and 152 and the electrode segments 155 and 156 are formed by patterning a second metal layer.

The first connecting segment 151 and the second connecting segment 152 extend corresponding to the extension-conductor segments 133 and 135 in the same direction. The first electrode segment 155 and the second electrode segment 156 are located below the first region 120.

In some embodiments, the first connecting segment 151 is arranged, corresponding to the extension-conductor segment 133, on (or below) the lower surface of the first insulation layer 110, and the second connecting segment 152 is arranged corresponding to, the extension-conductor segment 135, on (or below) the lower surface of the first insulation layer 110. The first connecting segment 151 may be located below the extension-conductor segment 133 and is overlapped with the extension-conductor segment 133. The second connecting segment 152 may be located below the extension-conductor segment 135 and is overlapped with the extension-conductor segment 135. In some embodiments, the first connecting segment 151 and/or the second connecting segment 152 are located below the first region 120 and correspondingly located between the two extension-conductor segments 133 and 135 rather than being overlapped with the corresponding extension-conductor segment 133/135.

Here, one end of the first electrode segment 155 is coupled to a side edge of the first connecting segment 151, and the other end of the first electrode segment 155 extends laterally relative to the coupled first connecting segment 151. The first electrode segment 151 extends towards the second connecting segment 152 from the side edge of the first connecting segment 151. In some embodiments, the first electrode segment 155 is approximately perpendicular to the first connecting segment 151.

One end of the second electrode segment 156 is coupled to a side edge of the second connecting segment 152, and the other end of the second electrode segment 156 extends laterally relative to the coupled second connecting segment 152. The second electrode segment 156 extends towards the first connecting segment 151 from the side edge of the second connecting segment 152. In some embodiments, the second electrode segment 156 is approximately perpendicular to the second connecting segment 152.

In some embodiments, the first electrode segment 155 and the second electrode segment 156 are arranged in a staggered manner.

In some embodiments, referring to FIG. 4 to FIG. 6, the capacitor component 150 includes three connecting segments 151, 152, and 153 (hereinafter referred to as the first connecting segment 151, the second connecting segment 152, and a third connecting segment 153) and a plurality of electrode segments 155, 156, 157, and 158 (hereinafter referred to as the first electrode segment 155, the second electrode segment 156, a third electrode segment 157, and a fourth electrode segment 158).

The electrode segments 155, 156, 157, and 158 serve as electrode plates of the capacitor, and capacitive induction is generated between the electrode segments 155 and 157 and between the electrode segments 156 and 158. The connecting segments 151 and 152 are used for receiving or transmitting a signal, and the connecting segment 153 is used for, for example, being grounded. The connecting segments 151, 152, and 153 and the electrode segments 155, 156, 157, and 158 are all formed on the lower surface of the first insulation layer 110. Here, the connecting segments 151, 152, and 153 and the electrode segments 155, 156, 157, and 158 are all formed by patterning the second metal layer.

The first connecting segment 151, the second connecting segment 153, and the third connecting segment 153 extend in a same direction. The third connecting segment 153 is located between the first connecting segment 151 and the second connecting segment 153 and located below the first region 120. The first electrode segment 155, the second electrode segment 156, the third electrode segment 157, and the fourth electrode segment 158 are located below the first region 120. The arrangement manner of the first connecting segment 151 and the second connecting segment 152 is approximately the same as the manner discussed above, and therefore is no longer elaborated.

Here, the first electrode segment 155 and the third electrode segment 157 are paired, and the second electrode segment 156 and the fourth electrode segment 158 are paired.

One end of the first electrode segment 155 is coupled to the side edge of the first connecting segment 151, and the other end of the first electrode segment 155 extends laterally relative to the coupled first connecting segment 151. The first electrode segment 151 extends towards the second connecting segment 152 and the third connecting segment 153 from the side edge of the first connecting segment 151 and is located between the first connecting segment 151 and the third connecting segment 153. In some embodiments, the first electrode segment 155 is approximately perpendicular to the first connecting segment 151.

One end of the second electrode segment 156 is coupled to the side edge of the second connecting segment 152, and the other end of the second electrode segment 156 extends laterally relative to the coupled second connecting segment 152. The second electrode segment 156 extends towards the first connecting segment 151 and the third connecting segment 153 from the side edge of the second connecting segment 152 and is located between the second connecting segment 152 and the third connecting segment 153. In some embodiments, the second electrode segment 156 is approximately perpendicular to the second connecting segment 152.

One end of the third electrode segment 157 is coupled to a side edge, near the first connecting segment 151, of the third connecting segment 153, and the other end of the third electrode segment 157 extends laterally relative to the coupled third connecting segment 153. The third electrode segment 157 extends towards the first connecting segment 151 from the side edge of the third connecting segment 153 and is located between the first connecting segment 151 and the third connecting segment 153. In some embodiments, the third electrode segment 157 is approximately perpendicular to the third connecting segment 153. In this embodiment, the first electrode segment 155 and the third electrode segment 157 are arranged in a staggered manner.

One end of the fourth electrode segment 158 is coupled to a side edge, near the second connecting segment 152, of the third connecting segment 153, and the other end of the fourth electrode segment 158 extends laterally relative to the coupled third connecting segment 153. The fourth electrode segment 158 extends towards the second connecting segment 152 from the side edge of the third connecting segment 153 and is located between the second connecting segment 152 and the third connecting segment 153. In some embodiments, the fourth electrode segment 158 is approximately perpendicular to the third connecting segment 153. In this embodiment, the fourth electrode segment 158 and the second electrode segment 156 are arranged in a staggered manner.

Figure 7:
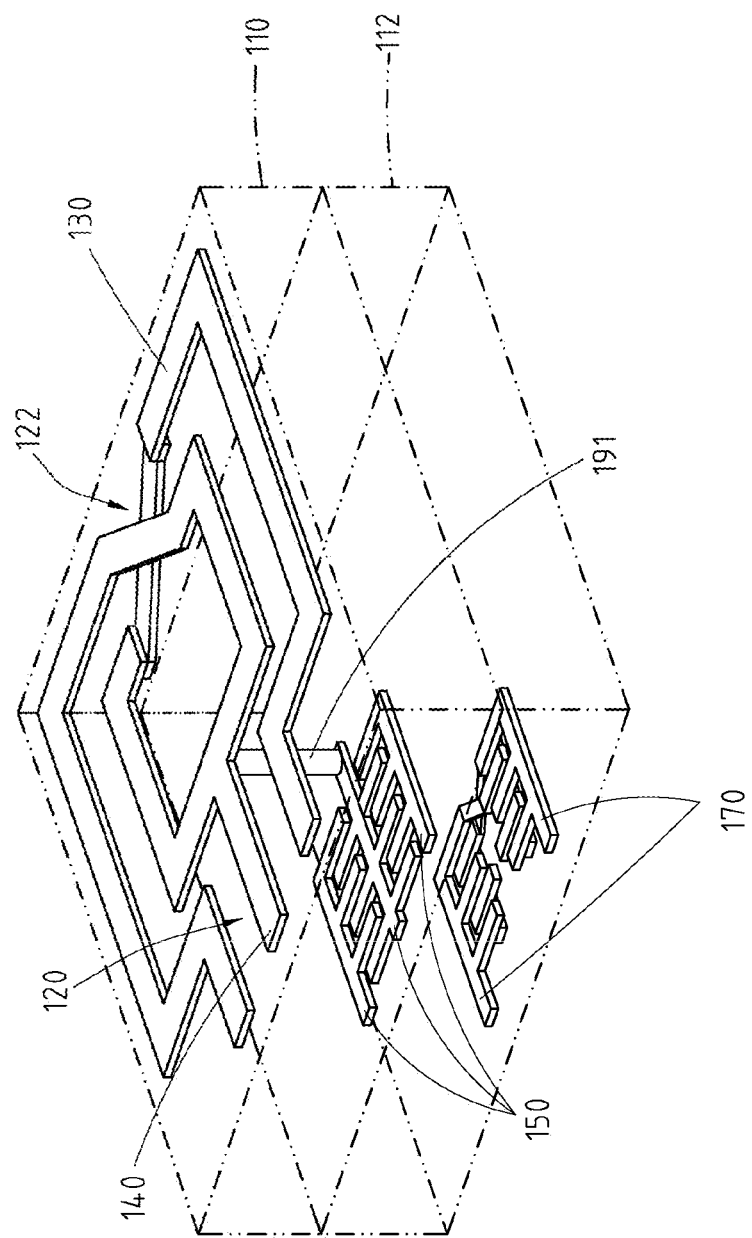
FIG. 7 is a perspective view of a semiconductor device with an LC resonant circuit according to a third embodiment of the present invention.
Figure 8:
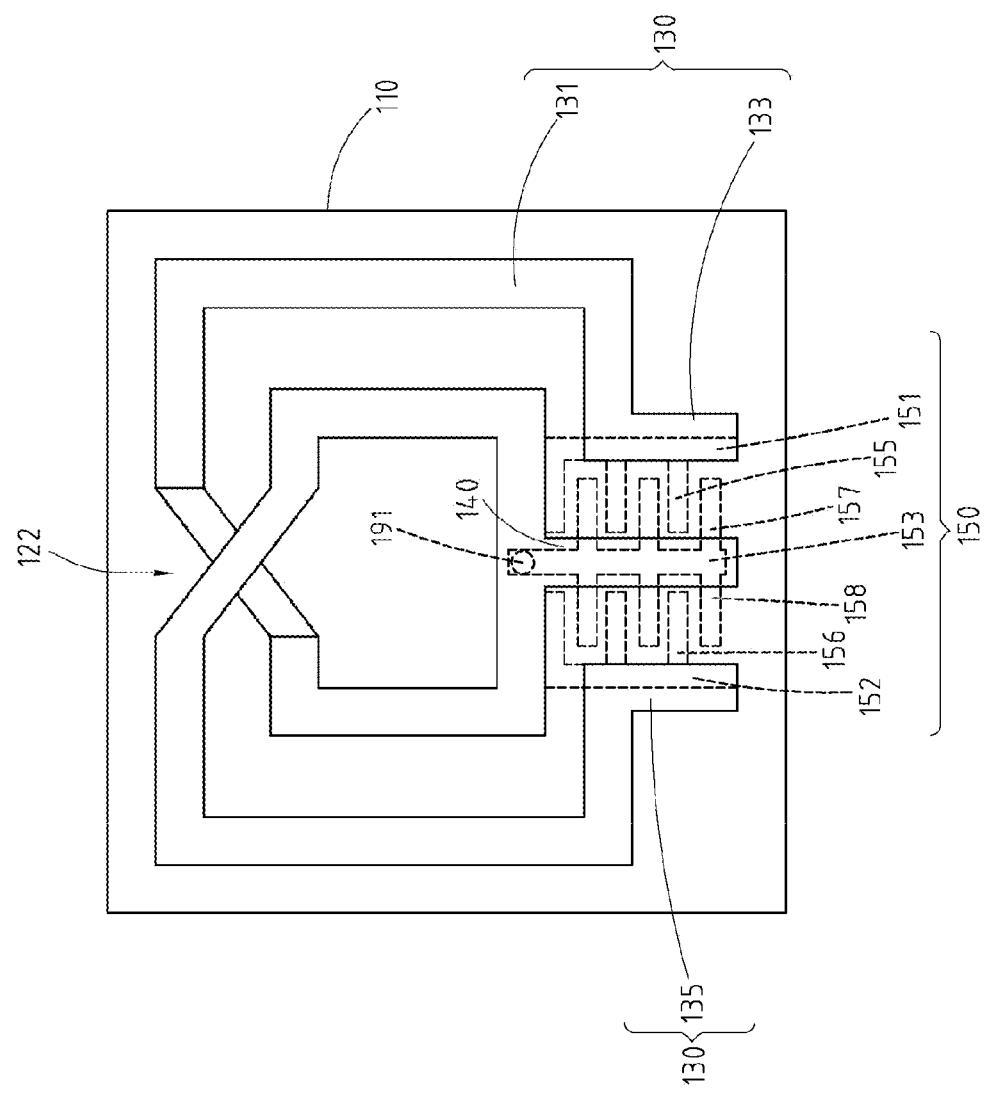
FIG. 8 is a top view of the semiconductor device shown in FIG. 7.
Figure 9:
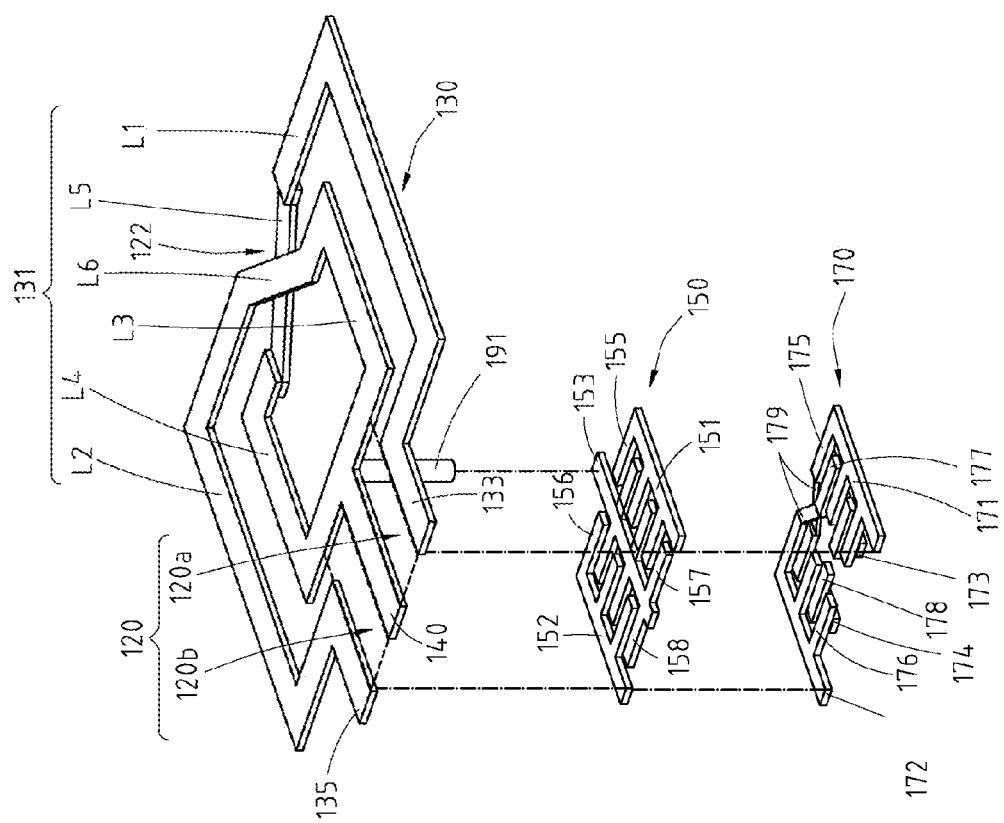
FIG. 9 is an exploded view of the semiconductor device shown in FIG. 7.

In some embodiments, the electrode segments 155, 156, 157, and 158 of the capacitor component 150 may be correspondingly configured outwards relative to the coil-conductor segment 131 from the joining part between the extension-conductor segments 133 and 135 and the coil-conductor segment 131, for example, shown in FIG. 1 to FIG. 6. In some embodiments, the electrode segments 155, 156, 157, and 158 of the capacitor component 150 may also be correspondingly configured outwards relative to the coil-conductor segment 131 from the outer side of a second loop (starting from the outer side) of the coil-conductor segment 131, for example, as shown in FIG. 7 to FIG. 9. In some embodiments, the electrode segments 155, 156, 157, and 158 may also be completely located below the first region 120 and correspondingly located between the two extension-conductor segments 133 and 135.

Figure 10:
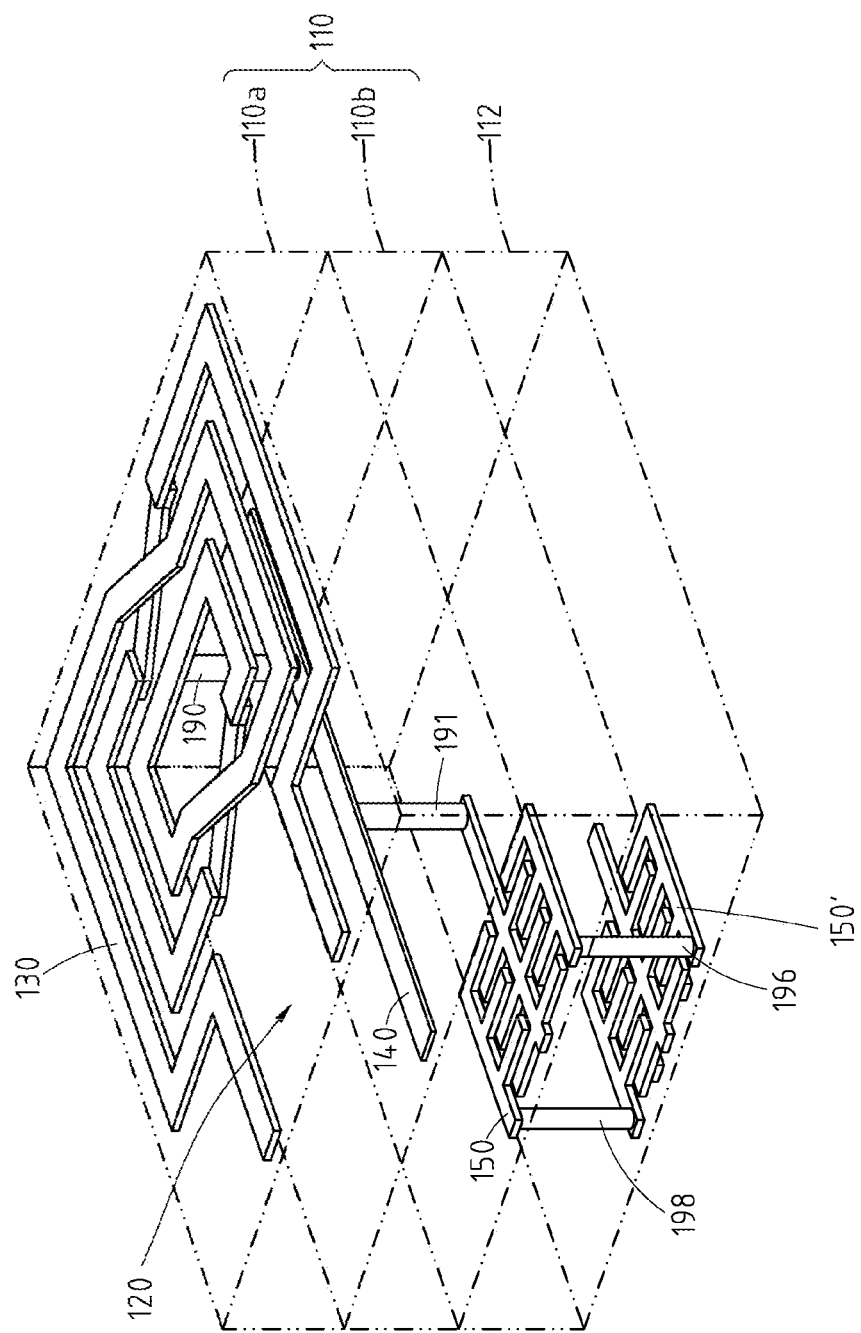
FIG. 10 is a perspective view of a semiconductor device with an LC resonant circuit according to a fourth embodiment of the present invention.
Figure 11:
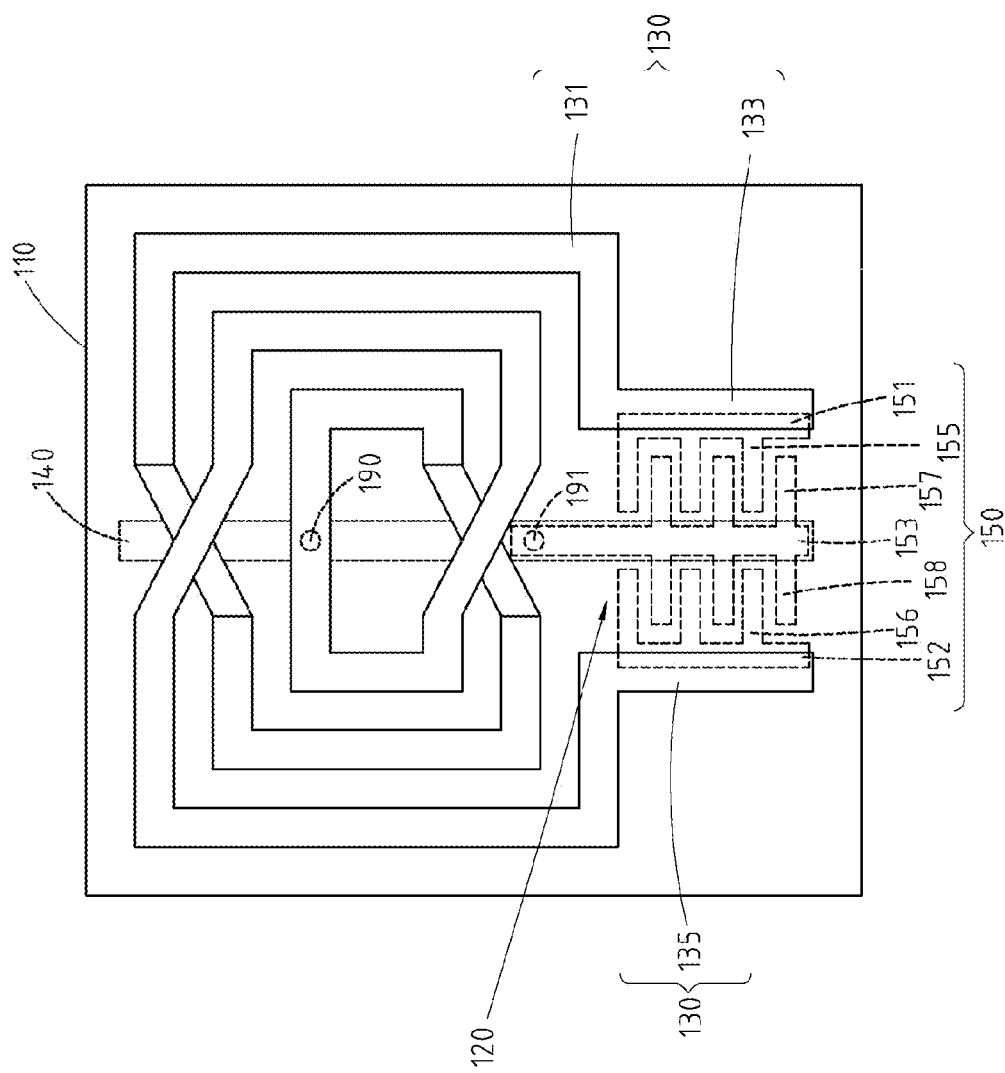
FIG. 11 is a top view of the semiconductor device shown in FIG. 10.
Figure 12:
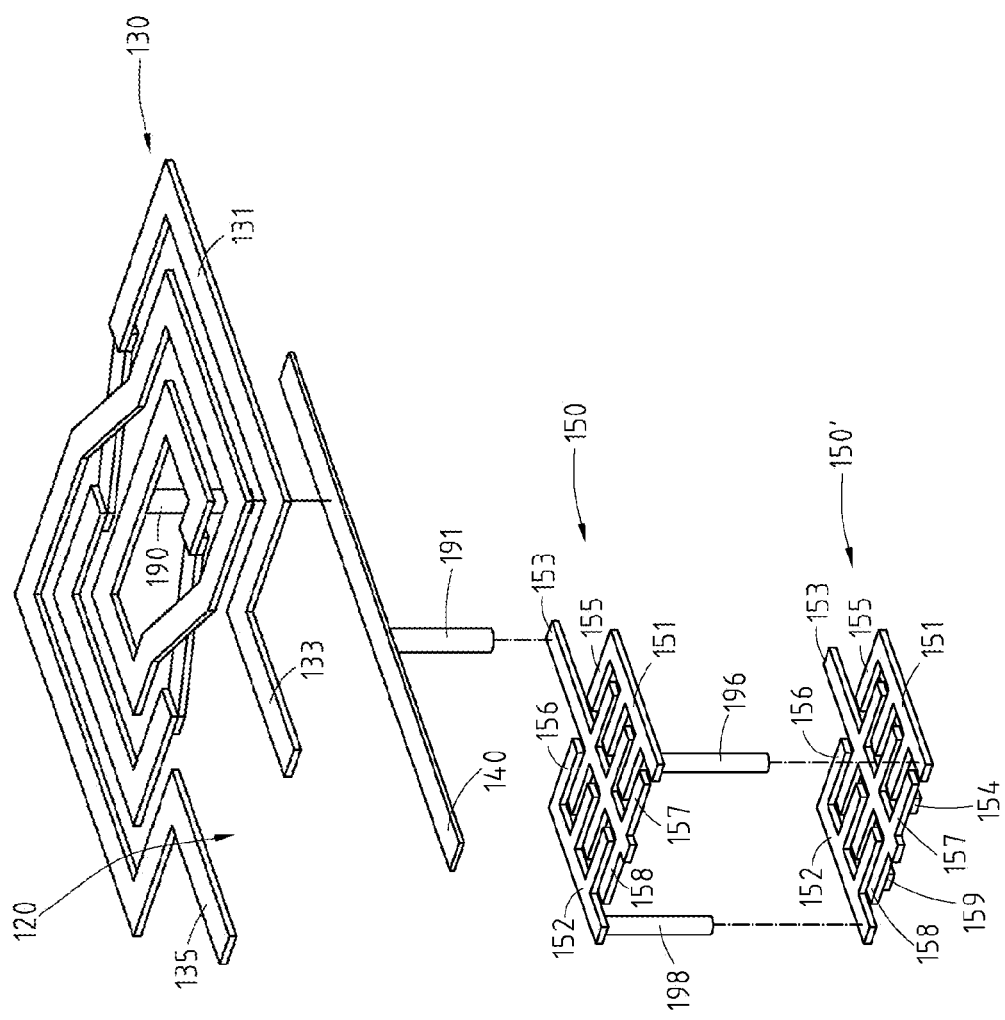
FIG. 12 is an exploded view of the semiconductor device shown in FIG. 10.
Figure 13:
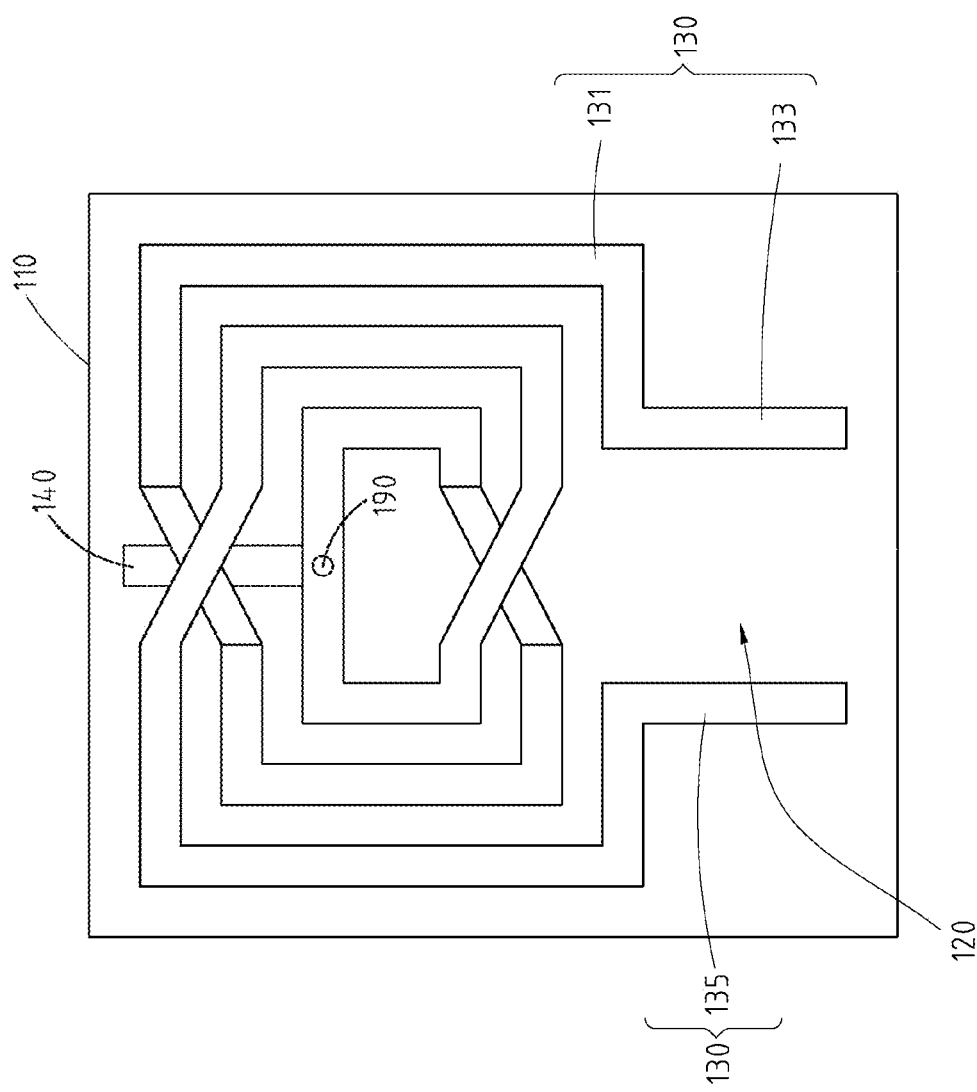
FIG. 13 is a perspective view of a semiconductor device with an LC resonant circuit according to a fifth embodiment of the present invention.

In some embodiments, referring to FIG. 7 to FIG. 12, the semiconductor device further includes an electronic component and another insulation layer 112 (hereinafter referred to as a second insulation layer 112). The electronic component may be an embedded electronic element such as another capacitor component 150' (as shown in FIG. 10 to FIG. 12), a transistor component 170 (as shown in FIG. 7 to FIG. 9), a diode component or a resistor component.

The electronic component is sandwiched between the first insulation layer 110 and the second insulation layer 112. The electronic component is arranged, corresponding to the first region 120, on the other surface, opposite to the capacitor component, of the second insulation layer 112. In other words, the capacitor component 150 is located on the upper surface of the second insulation layer 112, while the electronic component is located on the lower surface of the second insulation layer 112.

The electronic component is located on a circuit layer which is below the first region 120 and different from the circuit layer on which the capacitor component 150 is located. Here, the electronic component is formed by patterning a third metal layer on the lower surface of the second insulation layer 112.

Here, the electronic component may be entirely and correspondingly arranged between the outer sides of the extension-conductor segments 133 and 135. Moreover, the electronic component may also be correspondingly located between the outer side of one of the extension-conductor segments 133 and 135 and the inner outer side of the other of the extension-conductor segments 133 and 135. In addition, the electronic component may be further entirely and correspondingly arranged between the inner sides of the extension-conductor segments 133 and 135.

In some embodiments, when the electronic component is the transistor component 170 (referring to FIG. 7 to FIG. 9), the transistor component 170 includes two connecting segments 171 and 172, two semiconductor segments 173 and 174, and a plurality of electrode segments 175, 176, 177, and 178. The transistor component 170 may be a transistor or transistor capacitor operating at different ranges.

The connecting segments 171 and 172 and the electrode segments 175, 176, 177, and 178 are located on the lower surface of the second insulation layer 112. In some embodiments, the connecting segments 171 and 172 and the electrode segments 175, 176, 177, and 178 are formed by patterning the third metal layer located on the lower surface of the second insulation layer 112. The semiconductor segments 173 and 174 are formed by patterning a semiconductor material layer below the third metal layer.

The connecting segments 171 and 172 extend corresponding to the extension-conductor segments 133 and 135 in a same direction, respectively, and the semiconductor segments 172 and 173 and the electrode segments 175, 176, 177, and 178 are located below the first region 120. In some embodiments, the connecting segment 171 is overlapped with the corresponding extension-conductor segment 133, and the connecting segment 172 is overlapped with the corresponding extension-conductor segment 135. Furthermore, the connecting segment 171 and/or the connecting segment 172 may also be located below the first region 120 and correspondingly located between the two extension-conductor segments 133 and 135 rather than being overlapped with the corresponding extension-conductor segments 133 and 135.

One end of the electrode segment 175 is coupled to the side, near the connecting segment 172, of the connecting segment 171, and the other end of the electrode segment 175 extends towards the connecting segment 172. The electrode segment 177 and the electrode segment 175 extend in a same direction, and the electrode segment 177 is arranged at the side edge of the electrode segment 175 at an interval. When a plurality of electrode segments 175 and/or a plurality of electrode segments 177 are adopted, the electrode segments 175 and 177 are arranged in a staggered manner.

One end of the electrode segment 176 is coupled to the side, near the connecting segment 177, of the connecting segment 172, and the other end of the electrode segment 176 extends towards the connecting segment 171. The electrode segment 178 and the electrode segment 176 extend in a same direction, and the electrode segment 178 is arranged at the side edge of the electrode segment 176 at an interval. When a plurality of electrode segments 176 and/or a plurality of electrode segments 178 are adopted, the electrode segments 176 and 178 are arranged in a staggered manner.

The semiconductor segment 173 is located below the electrode segments 175 and 177 and extends in the configuration direction of the electrode segments 175 and 177. In some embodiments, the extension direction of the semiconductor segment 173 is approximately perpendicular to the extension direction of the electrode segments 175 and 177.

The semiconductor segment 174 is located below the electrode segments 176 and 178 and extends in the configuration direction of the electrode segments 176 and 178. In some embodiments, the extension direction of the semiconductor segment 174 is approximately perpendicular to the extension direction of the electrode segments 176 and 178.

Furthermore, the transistor component 170 may further include one or more bridged segments 179, and the one or more bridged segments 179 are located on the lower surface of the second insulation layer 112. In some embodiments, the one or more bridge segments 179 may also be formed by patterning the third metal layer. The two ends of the one or more bridge segments 179 are coupled to the electrode segments 175 and 178 respectively or coupled to the electrode segments 176 and 177 respectively.

In some embodiments, referring to FIG. 10 to FIG. 12, when the electronic component is the capacitor component 150', except being arranged on the lower surface of the second insulation layer 112, the configuration relationship of the capacitor component 150' may be approximately the same as that of the capacitor component 150.

Here, the structures of various embedded electronic elements are well known to in the field, and therefore are no longer elaborated.

In some embodiments, the inductor component 130 may adopt one turn, as shown in FIG. 4 to FIG. 6, or the inductor component 130 may also adopt two turns (as shown in FIG. 1 to FIG. 3 and FIG. 7 to FIG. 9), or three turns (as shown in FIG. 10 to FIG. 13), or more turns.

In some embodiments, the first region 120 may be limited between the two extension-conductor segments 133 and 135, such as shown in FIG. 6. In some embodiments, the first region 120 may be limited between the two extension-conductor segments 133 and 135 and the coil-conductor segment 131, as shown in FIG. 9.

For example, referring to FIG. 4 to FIG. 6, when the inductor component 130 adopts one turn, the first region 120 is sandwiched in a space between the two extension-conductor segments 133 and 135. Referring to FIG. 7 to FIG. 9, when the inductor component 130 adopts multiple turns, the first region 120 is sandwiched in a space between the two extension-conductor segments 133 and 135 and the second loop (starting from the outer side) of the coil-conductor segment 131, that is, the space is surrounded by the two extension-conductor segments 133 and 135 and the second loop of the coil-conductor segment 131.

In some embodiments, referring to FIG. 7 to FIG. 9, when the inductor component 130 adopts multiple turns, the coil-conductor segment 131 includes a plurality of semi-loop lines L1, L2, L3, and L4 and at least one pair of staggered parts. The illustration is provided below by using an example of two turns.

The semi-loop lines L1, L2, L3, and L4 may be distinguished to be two first semi-loop lines L1 and L3 and two second semi-loop lines L2 and L4, and each pair of staggered parts have two staggered guide lines L5 and L6.

The first semi-loop lines L1 and L3 and the extension-conductor segment 133 are located at a same side, and the second semi-loop lines L2 and L4 and the extension-conductor segment 135 are located at a same side.

One end of the first semi-loop line L1 is coupled to the extension-conductor segment 133, and the other end of the first semi-loop line L1 is coupled to one end of the staggered guide line L5. The other end of the staggered guide line L5 is coupled to one end of the second semi-loop line L4, and the other end of the second semi-loop line L4 is coupled to one end of the first semi-loop line L3. The other end of the first semi-loop line L3 is coupled to one end of the staggered guide line L6, and the other end of the staggered guide line L6 is coupled to one end of the second semi-loop line L2. The other end of the semi-loop line L2 is coupled to the extension-conductor segment 135.

The staggered guide lines L5 and L6 are staggered to each other, and another region 122 (hereinafter referred to as a second region 122) is defined by the other sides of the staggered guide lines L5 and L6.

Figure 14:
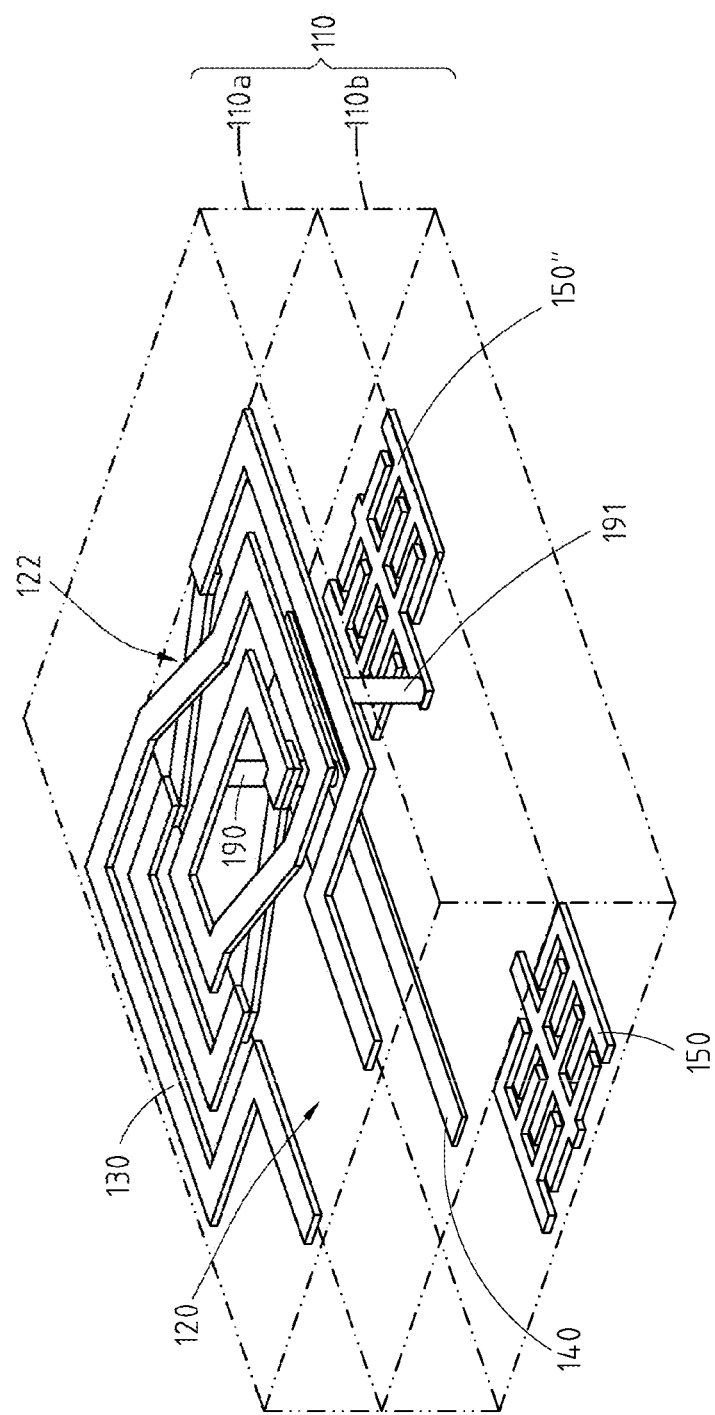
FIG. 14 is a perspective view of a semiconductor device with an LC resonant circuit according to a sixth embodiment of the present invention.
Figure 15:
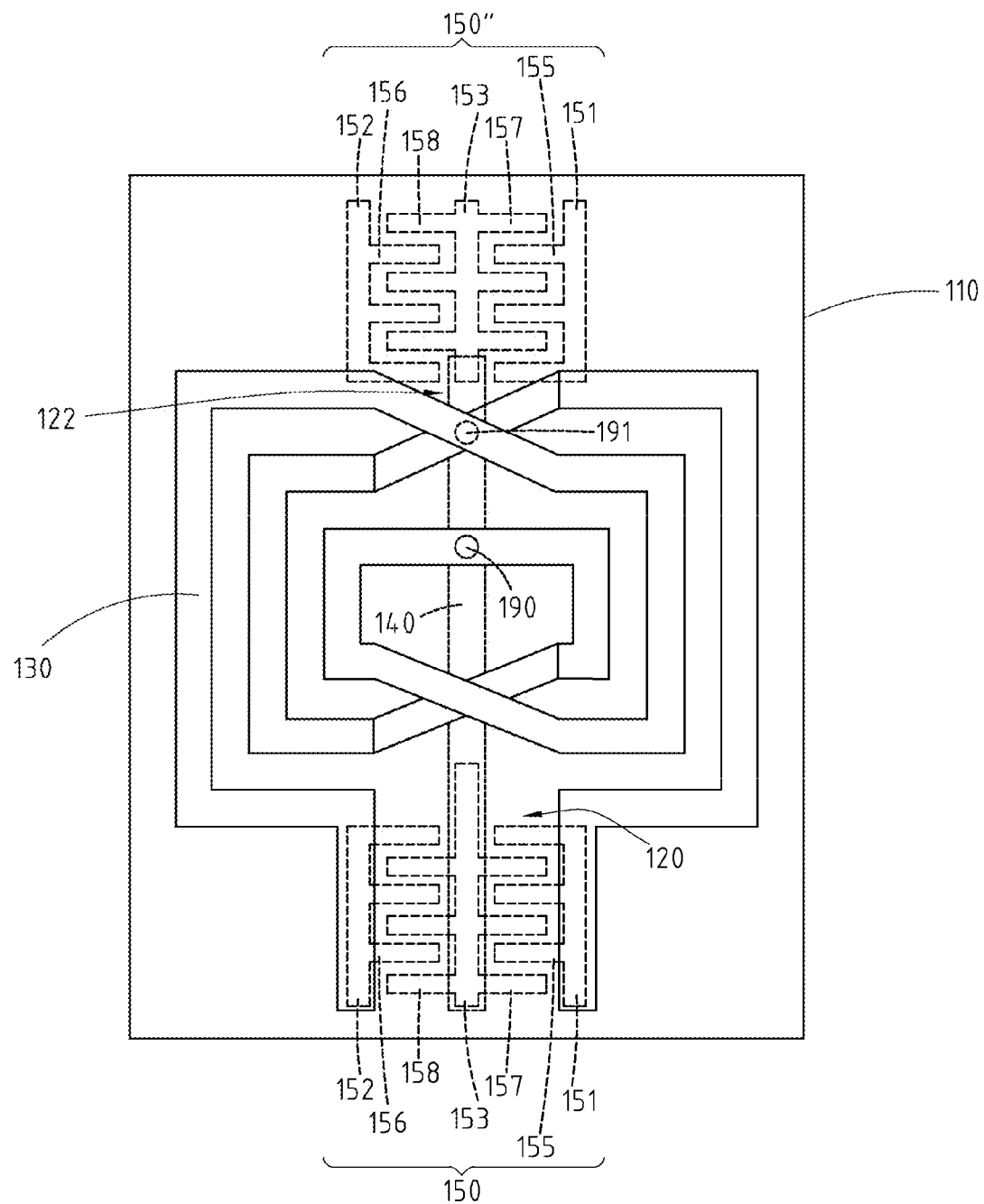
FIG. 15 is a top view of the semiconductor device shown in FIG. 14.
Figure 16:
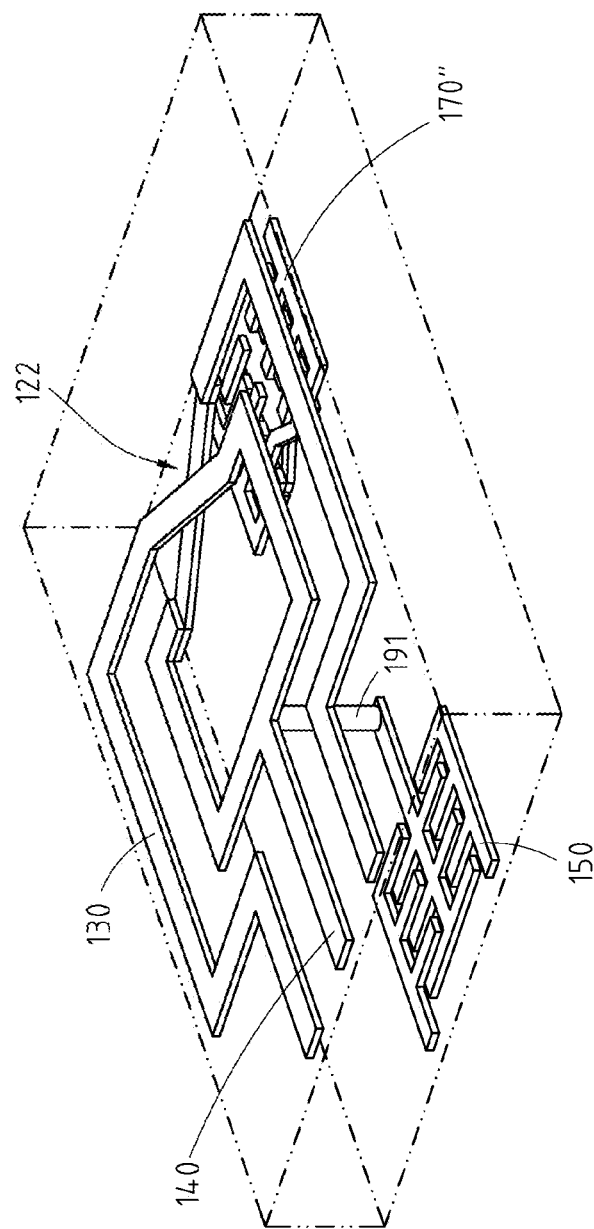
FIG. 16 is a perspective view of a semiconductor device with an LC resonant circuit according to a seventh embodiment of the present invention.
Figure 17:
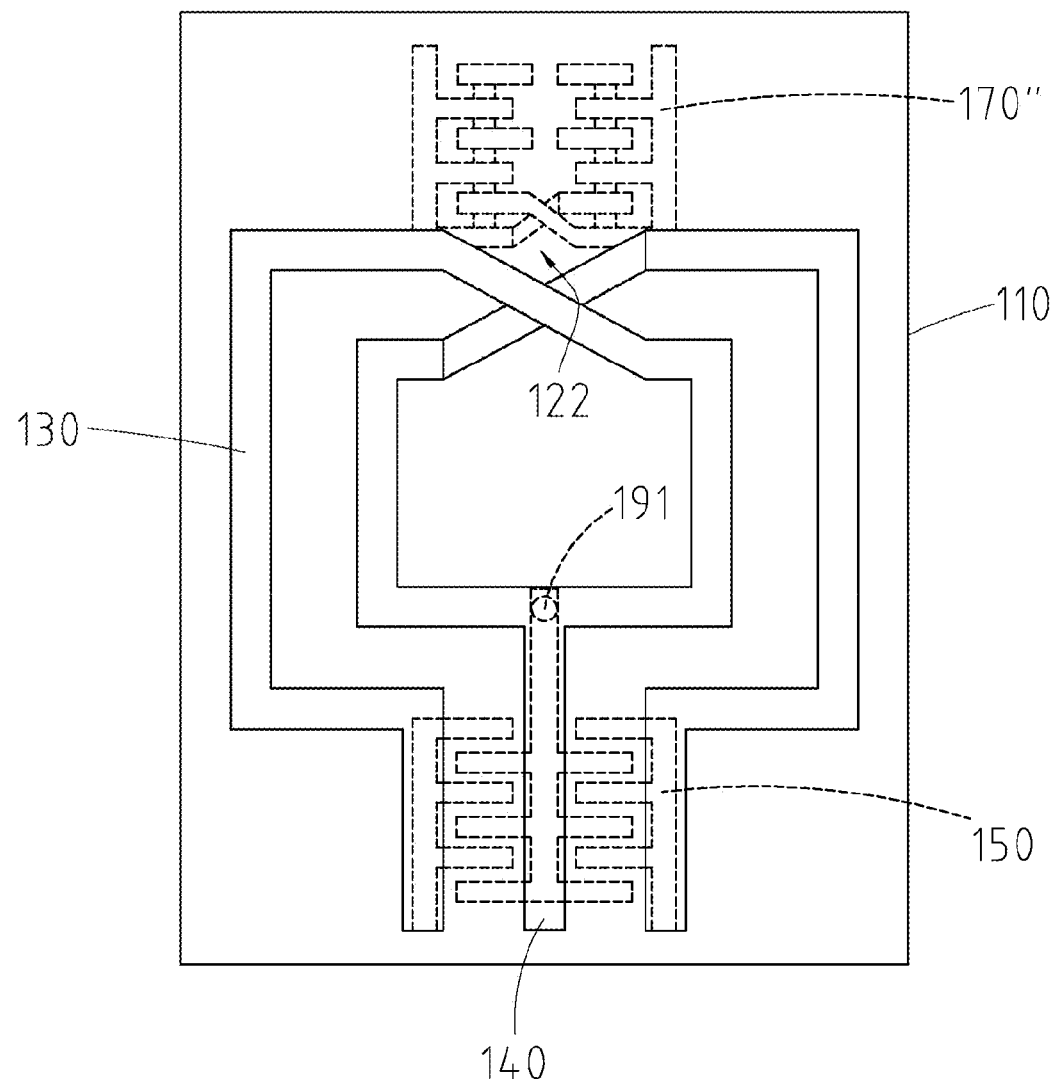
FIG. 17 is a top view of the semiconductor device shown in FIG. 16.

Here, referring to FIG. 14 to FIG. 17, an electronic component corresponding to the second region 122 may be further arranged on the other surface, opposite to the inductor component 130, of the first insulation layer 110 (i.e. the lower surface of the insulation layer 110) in an embedded manner. The electronic component corresponding to the second region 122 may be an embedded electronic element such as another capacitor component 150" (as shown in FIG. 14 and FIG. 15), the transistor component 170" (as shown in FIG. 16 and FIG. 17), a diode component or a resistor component. Here, the structure of the embedded electronic element is well known in the field, and therefore is no longer elaborated.

In some embodiments, the second region 122 is a hollow region, that is, a region without wiring located at an outer side of the staggered parts at the outermost side.

In some embodiments, referring to FIG. 7 to FIG. 17, the semiconductor device may further include a tap segment 140. The tap segment 140 is electrically connected to the coil-conductor segment 131, so that the tap segment 140 and the inductor component 130 form a tapped inductor. The tap segment 140 may be used for an electrical connection to a fixed potential, thereby providing a direct-current path, and/or a power supply, and/or grounding. The tap segment 140 is providing both a DC voltage path for inductor and a AC ground node for capacitors under or close to the inductor.

In some embodiments, referring to FIG. 7 to FIG. 9, FIG. 16, and FIG. 17, the tap segment 140 is formed on the upper surface of the first insulation layer 110, and the tap segment 140 and the inductor component 130 may be formed by patterning a same metal layer.

The tap segment 140 is arranged between the extension-conductor segments 133 and 135 and extends outwards in the same direction as the extension-conductor segments 133 and 135. Here, the tap segment 140 divides the first region 120 into a first hollow region 120a and a second hollow region 120b. The first hollow region 120a is a region without wiring surrounded by the extension-conductor segment 133, the coil-conductor segment 131, and the tap segment 140.

The second hollow region 120b is a region without wiring surrounded by the extension-conductor segment 135, the coil-conductor segment 131, and the tap segment 140.

When the tap segment 140 does not exist between the extension-conductor segments 133 and 135, the first region 120 is a hollow region, that is, is a region without wiring, as shown in FIG. 1 to FIG. 6 and FIG. 10 to FIG. 15.

In some embodiments, referring to FIG. 7, FIG. 10, and FIG. 14, the first insulation layer 100 may be divided into an upper layer 110a and a lower layer 110b. The tap segment 140 is sandwiched between the upper layer 110a and the lower layer 110b. In other words, the inductor component 130 is formed on an upper surface of the upper layer 110a, while the tap segment 140 is located on a lower surface (that is, an upper surface of the lower layer 110b) of the upper layer 110a. Here, the tap segment 140 and the inductor component 130 are located on different circuit layers. The tap segment 140 may be formed by patterning a fourth metal layer on the lower surface (that is, the upper surface of the lower layer 110b) of the upper layer 110a.

In some embodiments, any two of the electronic elements such as the inductor component 130, the tap segment 140, the capacitor components 150, 150', and 150", the transistor component 170 and 170', or other embedded electronic elements located on different circuit layers may be electrically conducted via a connection of other circuits. In other words, the electronic elements located on different circuit layers may be not directly connected through a via.

In some embodiments, referring to FIG. 1 to FIG. 17, any two of the electronic elements such as the inductor component 130, the tap segment 140, the capacitor components 150, 150', and 150", the transistor component 170 and 170', or other embedded electronic elements located on different circuit layers may also be electrically conducted through vias 190, 191, 192, 194, 196, and 198, so that two electronic elements are electrically connected in parallel or in series.

Referring FIG. 7 to FIG. 12, the via 190 is arranged between the tap segment 140 and the coil-conductor segment 131 and is used for electrically connecting the tap segment 140 and the coil-conductor segment 131. In other words, the via 190 penetrates from the upper surface of the upper layer 110a to the lower surface of the upper layer 110a, and enables conduction between the upper surface of the upper layer 110a and the lower surface of the upper layer 110a. One end of the via 190 is coupled to the coil-conductor segment 131, while the other end of the via 190 is coupled to the tap segment 140.

Referring to FIG. 4 to FIG. 9 and FIG. 11 to FIG. 14, the via 191 is arranged between the tap segment 140 and the connecting segment 153 of the capacitor component 150 (or 150'), and is used for electrically connecting the tap segment 140 and the connecting segment 153. In other words, the via 191 penetrates from the upper surface of the first insulation layer 110 to the lower surface of the first insulation layer 110, and enables the conduction between the upper surface of the first insulation layer 110 and the lower surface of the first insulation layer 110. Alternatively, the via 191 penetrates from the upper surface of the lower layer 110b to the lower surface of the lower layer 110b, and enables the conduction between the upper surface of the lower layer 110b and the lower surface of the lower layer 110b. One end of the via 191 is coupled to the coil-conductor segment 131, while the other end of the via 191 is coupled to the tap segment 140.

In some embodiments, the coil-conductor segment 131, the tap segment 140, and the connecting segment 153 may be electrically connected through a single via (the via 190 and the via 191 are located at a same vertical position, that is, are coaxial). In other words, the two ends of the via are coupled to the coil-conductor segment 131 and the connecting segment 153 respectively, and the tap segment 140 is coupled to the middle of the via.

Referring to FIG. 1 to FIG. 3, the via 194 is arranged between the extension-conductor segment 135 of the inductor component 130 and the connecting segment 152 of the capacitor component 150 and is used for electrically connecting the inductor component 130 and the capacitor component 150. In other words, the via 194 penetrates from the upper surface of the first insulation layer 110 to the lower surface of the first insulation layer 110, and enables the conduction between the upper surface of the first insulation layer 110 and the lower surface of the first insulation layer 110. One end of the via 194 is coupled to the extension-conductor segment 135, while the other end of the via 194 is coupled to the connecting segment 152.

Referring to FIG. 4 to FIG. 6, the via 192 is arranged between the extension-conductor segment 133 of the inductor component 130 and the connecting segment 151 of the capacitor component 150 and is used for electrically connecting the inductor component 130 and the capacitor component 150. In other words, the via 192 penetrates from the upper surface of the first insulation layer 110 to the lower surface of the first insulation layer 110, and enables the conduction between the upper surface of the first insulation layer 110 and the lower surface of the first insulation layer 110. One end of the via 192 is coupled to the extension-conductor segment 133, while the other end of the via 192 is coupled to the connecting segment 153.

In other words, the two ends of the inductor component 130 are conducted and connected with the two ends of the capacitor component 150 through the via 192 and the via 194 in a differential architecture, respectively.

Referring to FIG. 10 and FIG. 12, the via 196/198 is arranged between the connecting segment 151/152 of the capacitor component 150 and the electronic component (for example, the connecting segment 151/152 of the capacitor component 150') arranged below the capacitor component 150 and is used for electrically connecting the capacitor component 150 and the electronic component arranged below the capacitor component 150. In other words, the via 196 penetrates from the upper surface of the second insulation layer 112 to the lower surface of the second insulation layer 112, and enables the conduction between the upper surface of the second insulation layer 112 and the lower surface of the second insulation layer 112. One end of the via 196 is coupled to the connecting segment 151/152, while the other end of the via 196 is coupled to the electronic component (for example, the connecting segment 151/152 of the capacitor component 150') arranged below the capacitor component 150.

In some embodiments, the extension-conductor segment 133 and the connecting segments of all electronic components below the extension-conductor segment 133 may be electrically connected through a single via (the via 192 and the via 196 are located at a same vertical position, that is, are coaxial). For example, the two ends of the via are coupled to the extension-conductor segment 133 of the inductor component 130 and the connecting segment 151 of the capacitor component 150' (or the connecting segment of the transistor component 170) respectively, and the connecting segment 151 of the capacitor component 150 is coupled to the middle of the via.

Similarly, the extension-conductor segment 135 and the connecting segments of all electronic components below the extension-conductor segment 135 may be electrically connected through a single via (the via 194 and the via 198 are located at a same vertical position, that is, are coaxial). For example, the two ends of the via are coupled to the extension-conductor segment 135 of the inductor component 130 and the connecting segment 153 of the capacitor component 150' (or the connecting segment 173 of the transistor component 170) respectively, and the connecting segment 153 of the capacitor component 150 is coupled to the middle of the via.

In some embodiments, the capacitor components 150, 150', and 150" may be capacitors in various forms, such as a metal-oxide-metal (MOM) capacitor, a metal-insulator-metal (MIM) capacitor, or a metal-oxide-semiconductor (MOS) capacitor. Here, the structures of the capacitors in various forms are well known in the field. By using the MOS capacitor as an example and referring to FIG. 12, the capacitor component 150' further includes at least one semiconductor segment 154/159 in addition to the members shown in the foregoing embodiments. The semiconductor segment 154 (or 159) is located below the first electrode segment 155 (or 156) and the second electrode segment 157 (or 158) which are staggered at an interval of a dielectric layer, and the extension direction of the semiconductor segment 154/159 is approximately perpendicular to the extension direction of the first electrode segment 155/156 and the second electrode segment 157/158.

Here, the foregoing capacitor components 150, 150', and 150" and the electrode segments 175, 176, 177, and 178 of the transistor component 170 are all represented by a single metal layer in the drawings; however, the present invention is not limited thereto. In consideration of actual circuit demands, the foregoing capacitor components 150, 150', and 150" and the electrode segments 175, 176, 177, and 178 of the transistor component 170 may be formed by a single metal layer or a multi-layer metal stack.

Furthermore, the above-mentioned insulation layers may include one layer or multiple layers of insulating materials formed by one or more semiconductor processes.

In conclusion, in the semiconductor device with an LC resonant circuit according to the present invention, an LC resonant circuit may be integrated on a semiconductor substrate by means of a 3D die stacking technology, and a resonant capacitor is arranged corresponding to an input/output part of an inductor component, so as to reduce generation of phase noise, arrangement of interconnecting wires, and an overall size. In some embodiments, in the semiconductor device with an LC resonant circuit according to the present invention, other electronic components are arranged corresponding to the input/out part or a staggered part of the inductor component, so as to further reduce generation of phase noise, arrangement of interconnecting wires, parasitic RLC (Resistance-Inductance-Capacitance) and an overall size.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A semiconductor device with an inductor-capacitor (LC) resonant circuit, comprising:

a first insulation layer;

an inductor component, comprising:
  a coil-conductor segment, located on a surface of the first insulation layer; and
  two extension-conductor segments, located on the surface of the first insulation layer, coupled to two ends of the coil-conductor segment respectively, arranged at an interval, and extending outwards relative to the coil-conductor segment, wherein a first region is defined by the two extension-conductor segments and the coil-conductor segment; and
a capacitor component, arranged corresponding to the first region in an embedded manner on the other surface, opposite to the inductor component, of the first insulation layer, wherein the capacitor component is correspondingly configured outwards relative to the coil-conductor segment, and the capacitor component is not substantially overlapped with the coil-conductor segment,
wherein the capacitor component comprises:
  a plurality of connecting segments, extending corresponding to the two extension-conductor segments in a same direction, wherein the plurality of connecting segments are respectively overlapped with the two extension-conductor segments in a vertical direction; and
  a plurality of electrode segments, located below the first region, wherein one end of each of the plurality of electrode segments is coupled to one of the plurality of connecting segments, and each of the plurality of electrode segments extends laterally relative to the respective coupled connecting segment of the plurality of connecting segments.

2. The semiconductor device with an LC resonant circuit according to claim 1, further comprising:
  a second insulation layer, wherein the capacitor component is sandwiched between the first insulation layer and the second insulation layer; and
  an electronic component, arranged corresponding to the first region in an embedded manner on a surface, opposite to the capacitor component, of the second insulation layer.

3. The semiconductor device with an LC resonant circuit according to claim 2, wherein the electronic component is one of another capacitor component, a transistor component, a diode component, and a resistor component.

4. The semiconductor device with an LC resonant circuit according to claim 1, wherein the first region is defined between the two extension-conductor segments.

5. The semiconductor device with an LC resonant circuit according to claim 4, wherein the first region is defined between the two extension-conductor segments and the coil-conductor segment.

6. The semiconductor device with an LC resonant circuit according to claim 1, further comprising:
  a tap segment, electrically connected to the coil-conductor segment;
  wherein one of the plurality of connecting segments is located below the tap segment and overlapped with the tap segment.

7. The semiconductor device with an LC resonant circuit according to claim 1, wherein the coil-conductor segment has a pair of staggered parts, a second region is defined by outer sides of the pair of staggered parts, and the semiconductor device further comprises:
  an electronic component, arranged corresponding to the second region in an embedded manner on the other surface, opposite to the inductor component, of the first insulation layer.

8. The semiconductor device with an LC resonant circuit according to claim 7, wherein the electronic component is one of another capacitor component, a transistor component, a diode component, and a resistor component.

9. A semiconductor device with an inductor-capacitor (LC) resonant circuit, comprising:
  a first insulation layer;
  an inductor component, comprising:
    a coil-conductor segment, located on a surface of the first insulation layer; and
    two extension-conductor segments, located on the surface of the first insulation layer, coupled to two ends of the coil-conductor segment respectively, arranged at an interval, and extending outwards relative to the coil-conductor segment, wherein a first region is defined by the two extension-conductor segments and the coil-conductor segment; and
  a capacitor component, arranged corresponding to the first region in an embedded manner on the other surface, opposite to the inductor component, of the first insulation layer, wherein the capacitor component further comprises:
    a plurality of connecting segments, extending corresponding to the two extension-conductor segments in a same direction, wherein the plurality of connecting segments are respectively overlapped with the two extension-conductor segments in a vertical direction; and
    a plurality of electrode segments, located below the first region, wherein one end of each of the plurality of electrode segments is coupled to one of the plurality of connecting segments, and each of the plurality of electrode segments extends laterally relative to the respective coupled connecting segment of the plurality of connecting segments.

* * * * *